(12) United States Patent
Yoshii et al.

(10) Patent No.: US 11,619,687 B2
(45) Date of Patent: Apr. 4, 2023

(54) MAGNETIC FIELD MEASUREMENT APPARATUS AND MAGNETIC FIELD MEASUREMENT METHOD

(71) Applicant: SUMIDA CORPORATION, Tokyo (JP)

(72) Inventors: Yoshiharu Yoshii, Natori (JP); Norikazu Mizuochi, Kyoto (JP)

(73) Assignee: SUMIDA CORPORATION, Tokyo (JP)

( * ) Notice: Subject to any disclaimer, the term of this patent is extended or adjusted under 35 U.S.C. 154(b) by 155 days.

(21) Appl. No.: 17/192,639

(22) Filed: Mar. 4, 2021

(65) Prior Publication Data

US 2021/0190883 A1    Jun. 24, 2021

Related U.S. Application Data

(63) Continuation of application No. 16/456,930, filed on Jun. 28, 2019, now Pat. No. 10,969,445.

(30) Foreign Application Priority Data

Jul. 3, 2018 (JP) .............................. JP2018-126541

(51) Int. Cl.
G01R 33/032        (2006.01)
(52) U.S. Cl.
CPC .................................. *G01R 33/032* (2013.01)
(58) Field of Classification Search
CPC .................................................. G01R 33/032
See application file for complete search history.

(56) References Cited

U.S. PATENT DOCUMENTS 10,969,445 B2 *  4/2021  Yoshii ................... G01N 24/10
2006/0126990 A1    6/2006  Deng
(Continued)

FOREIGN PATENT DOCUMENTS

JP          5220123 A     2/1992
JP       2012110489 A     6/2012
(Continued)

OTHER PUBLICATIONS

Victor M Acosta et al. "Broadband nagnetometry by infrared-absorption jetection of diamond NV centers" Oct. 22, 2018, 5 pages.
(Continued)

*Primary Examiner* — Paresh Patel
(74) *Attorney, Agent, or Firm* — Cowan, Liebowitz & Latman, P.C.; Mark Montague

(57) ABSTRACT

An ODMR member is arranged in a measurement target AC magnetic field. A coil applies a magnetic field of a microwave to the ODMR member. A high frequency power supply causes the coil to conduct a current of the microwave. An irradiating device irradiates the ODMR member with light. A light receiving device detects light that the ODMR member emits. A measurement control unit performs a predetermined DC magnetic field measurement sequence at a predetermined phase of the measurement target AC magnetic field, and in the DC magnetic field measurement sequence, controls the high frequency power supply and the irradiating device and thereby determines a detection light intensity of the light detected by the light receiving device. A magnetic field calculation unit calculates an intensity of the measurement target AC magnetic field on the basis of the predetermined phase and the detection light intensity.

7 Claims, 3 Drawing Sheets

(56) References Cited

U.S. PATENT DOCUMENTS

2017/0016963 A1 1/2017 Kimura et al.
2020/0011939 A1* 1/2020 Yoshii .................... G01N 24/10
2020/0132785 A1 4/2020 Yoshii

FOREIGN PATENT DOCUMENTS

WO   2015136931 A1   9/2015
WO   2018174907 A1   9/2018

OTHER PUBLICATIONS

Kasper Jensen et al., "Magnetometry with Nitrogen-Vacancy Centers in Diamond" in: "High Sensitivity Magnetometers", (2017), Springer International Publishing, 15 pages.

Eisuke Abe et al., Tutorial: Magnetic resonance with nitrogen-vacancy centers in jiamond—microwave engineering, materials science, and magnetometry Feb. 23, 2018, 16 pages.

D Farfurnik et al: "Spin ensemble-based AC magnetometry using concatenated dynamical decoupling at low temperatures", Dec. 13, 2017, 5 pages.

The articles were cited in a Dec. 3, 2019 European search report, that issued in European Patent Application No. 19 18 2758.

Extended Search Report dated Mar. 4, 2022 of European Application No. 21 21 4447.

Victor M Acosta et al., "Broadband magnetometry by infrared-absorption detection of diamond NV centers and associated temperature dependence", Proceedings of Spie, vol. 7948,Mar. 10, 2011, Article previously submitted with IDS on Mar. 4, 2021.

Kasper Jensen et al., "Magnetometry with Nitrogen-Vacancy Centers in Diamond" in: "High Sensitivity Magnetometers", 2017, Springer, Switzerland, Article previously submitted with IDS on Mar. 4, 2021.

Eisuke Abe et al., Tutorial: Magnetic resonance with nitrogen-vacancy centers in diamond—microwave engineering, materials science, and magnetometry arxiv.org, Cornell University Library, 201 Olin Library Cornell University Ithaca, NY 4853, Feb. 22, 2018, Article previously submitted with IDS on Mar. 4, 2021.

D Farfurnik et al. "Spin ensemble-based AC magnetometry using concatenated dynamical decoupling at low temperatures", arxiv.org, Cornell University Library, 201 Olin Library Cornell University Ithaca, NY 14853, Sep. 11, 2017, Article previously submitted with IDS on Mar. 4, 2021.

* cited by examiner

MAGNETIC FIELD MEASUREMENT APPARATUS AND MAGNETIC FIELD MEASUREMENT METHOD

CROSS-REFERENCE TO RELATED APPLICATIONS

This application is a continuation of U.S. patent application Ser. No. 16/456,930, filed Jun. 28, 2019, which relates to and claims priority rights from Japanese Patent Application No. 2018-126541, filed on Jul. 3, 2018, the entire disclosures of which are hereby incorporated by reference herein.

BACKGROUND

Technical Field

The present invention relates to a magnetic field measurement apparatus and a magnetic field measurement method.

Background Art

A magnetic measurement apparatus performs magnetic measurement with ODMR (Optically Detected Magnetic Resonance) that uses electron spin resonance (See Patent Literature #1, for example).

In ODMR, a medium that has sublevels and an optical transition level as energy level is simultaneously irradiated with a high-frequency magnetic field (microwave) and light, and thereby a population change or the like due to magnetic resonance between the sublevels is detected as an optical signal with high sensitivity. In general, after an electron in a ground state is excited with green light, the electron emits red light when returning the ground state. For example, when an electron is irradiated with a high-frequency magnetic field of about 2.87 GHz in a nitrogen and a lattice defect in a diamond structure (NVC: Nitrogen Vacancy Center), the electron moves from the lowest level (ms=0) among three sublevels of the ground state to an energy level (ms=+1 or −1) higher than the lowest level among the three sublevels. When the electron in such state is irradiated with green light, an emitting light intensity is decreased because of no radiation transition to the lowest level (ms=0) among the three levels of the ground level; and therefore, it can be determined by detecting this light whether magnetic resonance occurs due to the high-frequency magnetic field. As mentioned, in ODMR, optically detected magnetic resonance material such as NVC is used.

A measurement method of DC magnetic field using an NVC is performed in accordance with Ramsey Pulse Sequence. In Ramsey Pulse Sequence, (a) an NVC is irradiated with excitation light, (b) a first pi/2 pulse of a microwave is applied to the NVC, (c) a second pi/2 pulse of a microwave is applied to the NVC with a predetermined time interval tt from the first pi/2 pulse, (d) the NVC is irradiated with measurement light, and an intensity of light emitted thereby of the NVC is measured, and (e) a magnetic flux density is estimated on the basis of the measured intensity of the light.

Further, a measurement method of alternating (AC) magnetic field using an NVC is performed in accordance with Spin Echo Pulse Sequence. In Spin Echo Pulse Sequence, (a) an NVC is irradiated with excitation light, (b) a first pi/2 pulse of a microwave is applied to the NVC at 0-degree phase of a measurement target magnetic field, (c) a pi pulse of a microwave is applied to the NVC at 180-degree phase of the measurement target magnetic field, (d) a second pi/2 pulse of a microwave is applied to the NVC at 360-degree phase of the measurement target magnetic field, (e) the NVC is irradiated with measurement light, and an intensity of light emitted thereby of the NVC is measured, and (f) a magnetic flux density is estimated on the basis of the measured intensity of the light.

CITATION LIST

Patent Literature

Patent Literature #1: Japanese Patent Application Publication No. 2012-110489.

SUMMARY

Technical Problem

However, in Spin Echo Pulse Sequence, if a time interval between the first pi/2 pulse and the pi pulse, and a time interval between the pi pulse and the second pi/2 pulse get long, a proper AC magnetic field with a low frequency and a long wavelength is hardly measured because a spin of an electron is too dispersed in an ODMR material in which a uniform spin state was forced by the excitation light.

The present invention has been conceived to provide a magnetic field measurement apparatus and a magnetic field measurement method that perform proper measurement of a low-frequency AC magnetic field using ODMR.

Solution to Problem

A magnetic field measurement apparatus according to an aspect of the present invention includes an optically detected magnetic resonance member arranged in a measurement target AC magnetic field, a coil, a high frequency power supply, an irradiating device, a light receiving device, a measurement control unit, and a magnetic field calculation unit. The coil applies a magnetic field of a microwave to the optically detected magnetic resonance member. The high frequency power supply causes the coil to conduct a current of the microwave. The irradiating device irradiates the optically detected magnetic resonance member with light. The light receiving device detects light that the optically detected magnetic resonance member emits. The measurement control unit performs a predetermined DC magnetic field measurement sequence at a predetermined phase of the measurement target AC magnetic field, and in the DC magnetic field measurement sequence, controls the high frequency power supply and the irradiating device and thereby determines a detection light intensity of the light detected by the light receiving device. The magnetic field calculation unit calculates an intensity of the measurement target AC magnetic field on the basis of the predetermined phase and the detection light intensity.

A magnetic field measurement method according to an aspect of the present invention includes the steps of: (a) performing a predetermined DC magnetic field measurement sequence at predetermined phase of a measurement target AC magnetic field using an optically detected magnetic resonance member arranged in a measurement target AC magnetic field, a coil that applies a magnetic field of a microwave to the optically detected magnetic resonance member, a high frequency power supply that causes the coil to conduct a current of the microwave, an irradiating device that irradiates the optically detected magnetic resonance member with light, and a light receiving device that detects light that the optically detected magnetic resonance member emits, the predetermined DC magnetic field measurement sequence controlling the high frequency power supply and the irradiating device and thereby determining a detection light intensity of the light detected by the light receiving device; and (b) calculating an intensity of the measurement target AC magnetic field on the basis of the predetermined phase and the detection light intensity.

Advantageous Effects of Invention

The present invention provides a magnetic field measurement apparatus and a magnetic field measurement method that perform proper measurement of a low-frequency AC magnetic field using ODMR.

These and other objects, features and advantages of the present disclosure will become more apparent upon reading of the following detailed description along with the accompanied drawings.

DETAILED DESCRIPTION

Hereinafter, embodiments according to aspects of the present invention will be explained with reference to drawings.

Embodiment 1

Figure 1:
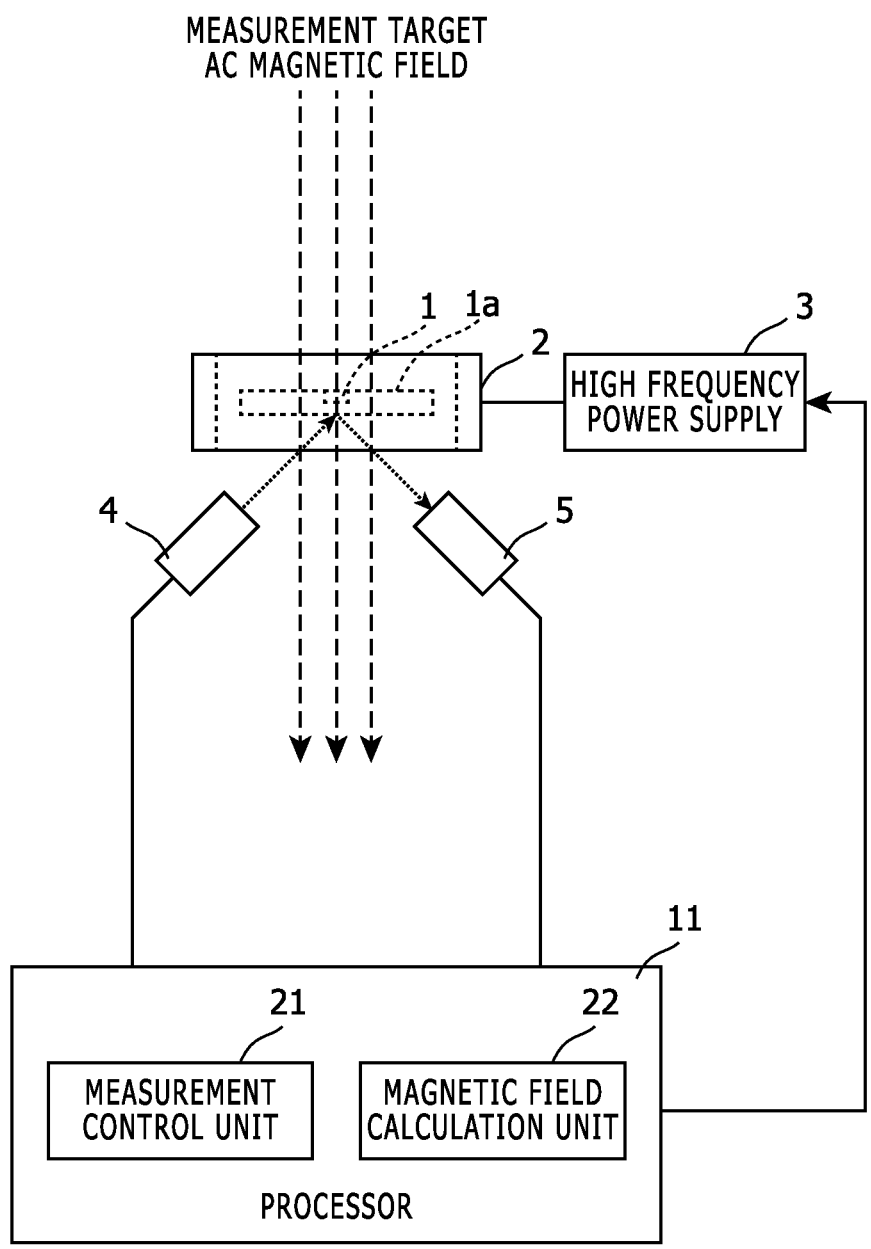
FIG. 1 shows a diagram that indicates a configuration of a magnetic field measurement apparatus according to an embodiment of the present invention.

FIG. 1 shows a diagram that indicates a configuration of a magnetic field measurement apparatus according to an embodiment of the present invention. The magnetic field measurement apparatus shown in FIG. 1 includes an ODMR member 1. In this embodiment, the ODMR member 1 is a board member such as a diamond including an NVC, and is fixed to a support board 1a. This ODMR member 1 is arranged in a measurement target AC magnetic field.

Further, the magnetic field measurement apparatus includes a coil 2, a high frequency power supply 3, an irradiating device 4, and a light receiving device 5.

The coil 2 applies a magnetic field of a microwave to the ODMR member 1. A frequency of the microwave is set in accordance with a type of the ODMR member 1. For example, if the ODMR member 1 is a diamond including an NVC, the coil 2 applies a microwave magnetic field of about 2.87 GHz. The high frequency power supply 3 causes the coil 2 to conduct a current of a microwave (i.e. a current to generate the aforementioned microwave magnetic field).

The irradiating device 4 irradiates the ODMR member 1 with light (excitation light of a predetermined wavelength and measurement light of a predetermined wavelength). The light receiving device 5 detects fluorescence emitted from the ODMR member 1 when the ODMR member 1 is irradiated with the measurement light.

Further, the magnetic field measurement apparatus includes a processor 11. The processor 11 includes a computer, for example, and executes a program with the computer and thereby acts as sorts of processing units. In this embodiment, the processor 11 acts as a measurement control unit 21 and a magnetic field calculation unit 22.

The measurement control unit 21 performs a predetermined DC magnetic field measurement sequence at a predetermined phase of the measurement target AC magnetic field; and in the DC magnetic field measurement sequence, controls the high frequency power supply 3 and the irradiating device 4 and thereby determines a detection light intensity of the fluorescence detected by the light receiving device 5. For example, the irradiating device 4 includes a laser diode or the like as a light source, and the light receiving device 5 includes a photo diode or the like as a photodetector, and the measurement control unit 21 determines the aforementioned detection light intensity on the basis of an output signal of the light receiving device 5, and this output signal is obtained by amplification and/or the like of an output signal of the photodetector.

In this embodiment, Ramsey Pulse Sequence is applied as the aforementioned predetermined DC magnetic field measurement sequence. However, the aforementioned DC magnetic field measurement sequence is not limited to that.

Further, the aforementioned predetermined phase, as a measurement timing of the measurement target AC magnetic field, is determined on the basis of a phase of an external AC signal that is a known signal in synchronization with the measurement target AC magnetic field. For example, if the measurement target AC magnetic field is generated by a physical phenomenon due to the external AC signal, then the measurement target AC magnetic field may be in synchronization with the external AC signal. Therefore, the measurement control unit 21 watches the external AC signal, and performs the aforementioned DC magnetic field measurement sequence so as to coincide with a timing of the aforementioned predetermined phase as a measurement timing.

Alternatively, for example, the aforementioned predetermined phase as a measurement timing may be determined so as to (a) repeatedly perform the aforementioned DC magnetic field measurement sequence with a time interval significantly shorter than an estimated period of the measurement target AC magnetic field, (b) determine a timing of 0-degree phase or 180-degree phase of the measurement target AC magnetic field and a period of the measurement target AC magnetic field on the basis of a time-sequential change of the magnetic field intensities (magnetic flux densities) obtained by plural times of the DC magnetic field measurement sequence, and (c) determine the aforementioned predetermined phase as a measurement timing from the determined timing of 0-degree or 180-degree phase and the determined period.

The magnetic field calculation unit 22 calculates an intensity (here, an amplitude of a magnetic flux density) of the measurement target AC magnetic field on the basis of the aforementioned predetermined phase and the detection light intensity.

For example, the magnetic field calculation unit 22 calculates the magnetic flux density from the detection light intensity in accordance with the following formula.

$$S=[(a+b)/2]+[(a-b)/2]*\cos(\text{Gamma}*B*tt)$$

Here, S is the detection light intensity, B is the magnetic flux density, a and b are constants, tt is the time interval between the two pi/2 pulses (free precession time), and Gamma is a gyromagnetic ratio (constant). It should be noted that the constants a and b are the largest and the smallest values when B or tt is changed, and can be determined by measuring S while changing tt under a condition of a known and constant B in an experiment, for example. In addition, the constant a may be derived as the detection light intensity when B=0.

Specifically, the magnetic field calculation unit 22 assumes that the measurement target AC magnetic field is a sine wave and calculates an intensity (an amplitude of a magnetic flux density) of the measurement target AC magnetic field from a magnetic field intensity (magnetic flux density) obtained from the detection light intensity on the basis of a ratio between a value of the sine wave at the phase that the detection light intensity is obtained and a peak value of the sine wave.

For example, in case of a normalized sine wave, a peak value (i.e. a value at 90-degree phase) is 1, and a value of 80-degree phase is 0.985. Therefore, for example, if the aforementioned predetermined phase is 80 degrees, then an intensity (an amplitude of a magnetic flux density) of the measurement target AC magnetic field is obtained by dividing a magnetic field intensity (magnetic flux density) obtained from the detection light intensity by 0.985. Further, the aforementioned predetermined phase may be 90 degrees, and if it is 90 degrees, then an intensity (an amplitude of a magnetic flux density) of the measurement target AC magnetic field is obtained that is equal to a magnetic field intensity (magnetic flux density) obtained from the detection light intensity.

Further, in Embodiment 1, the measurement control unit 21 (a) performs the DC magnetic field measurement sequence at a predetermined first phase of the measurement target AC magnetic field, and in this DC magnetic field measurement sequence, controls the high frequency power supply 3 and the irradiating device 4 and determines a detection light intensity of light detected by the light receiving device 5, and (b) performs the DC magnetic field measurement sequence at a predetermined second phase of the measurement target AC magnetic field, and in this DC magnetic field measurement sequence, controls the high frequency power supply 3 and the irradiating device 4 and determines a detection light intensity of light detected by the light receiving device 5. The magnetic field calculation unit 22 calculates the magnetic flux density (positive value) at the first phase, and the magnetic flux density (negative value) at the second phase from the first phase, the second phase, the detection light intensity at the first phase, and the detection light intensity at the second phase, and calculates an intensity of the measurement target AC magnetic field based on a difference between the magnetic flux density (positive value) at the first phase and the magnetic flux density (negative value) at the second phase.

Here, the first and second phases are set such that an absolute value of a difference between the first phase and pi/2 (i.e. 90 degrees) and an absolute value of a difference between the second phase and 3*pi/2 (i.e. 270 degrees) are substantially identical to each other. The first phase is any in the range from 0 degree to 180 degrees, and the second phase is any in the range from 180 degrees to 360 degrees. Thus, assuming that the measurement target AC magnetic field is a sine wave, if the first and second phases are set in the aforementioned manner, then an absolute value of a magnetic field intensity at the first phase and an absolute value of a magnetic field intensity at the second phase get substantially equal to each other. Directions of the measurement target AC magnetic field at such two phases are opposite to each other and the magnetic field intensities (i.e. absolute values of the magnetic flux densities) are substantially identical to each other, and therefore, using an average of them removes influence of a stationary magnetic noise (e.g. earth magnetism or the like).

For example, let B0 be the magnetic flux density of the measurement target AC magnetic field at the first phase, let −B0 be the magnetic flux density of the measurement target AC magnetic field at the second phase, and let B noise be a stationary magnetic noise, and therefore, the magnetic flux density B1 measured at the first phase is B0+B noise and the magnetic flux density B2 measured at the second phase is −B0+B noise and consequently, the difference between the both is 2*B0. Therefore, the magnetic field calculation unit 22 calculates one half of the difference as an intensity of the measurement target AC magnetic field.

For example, if the first phase is set as 90 degrees and the second phase is set as 270 degrees, then an intensity of the measurement target AC magnetic field is derived as one half of a difference between the magnetic flux density at the first phase and the magnetic flux density at the second phase. Further, for example, if the first phase is set as 80 degrees and the second phase is set as 260 degrees, then an intensity of the measurement target AC magnetic field is derived from one half of a difference between the magnetic flux density at the first phase and the magnetic flux density at the second phase on the basis of the aforementioned ratio.

Figure 2:
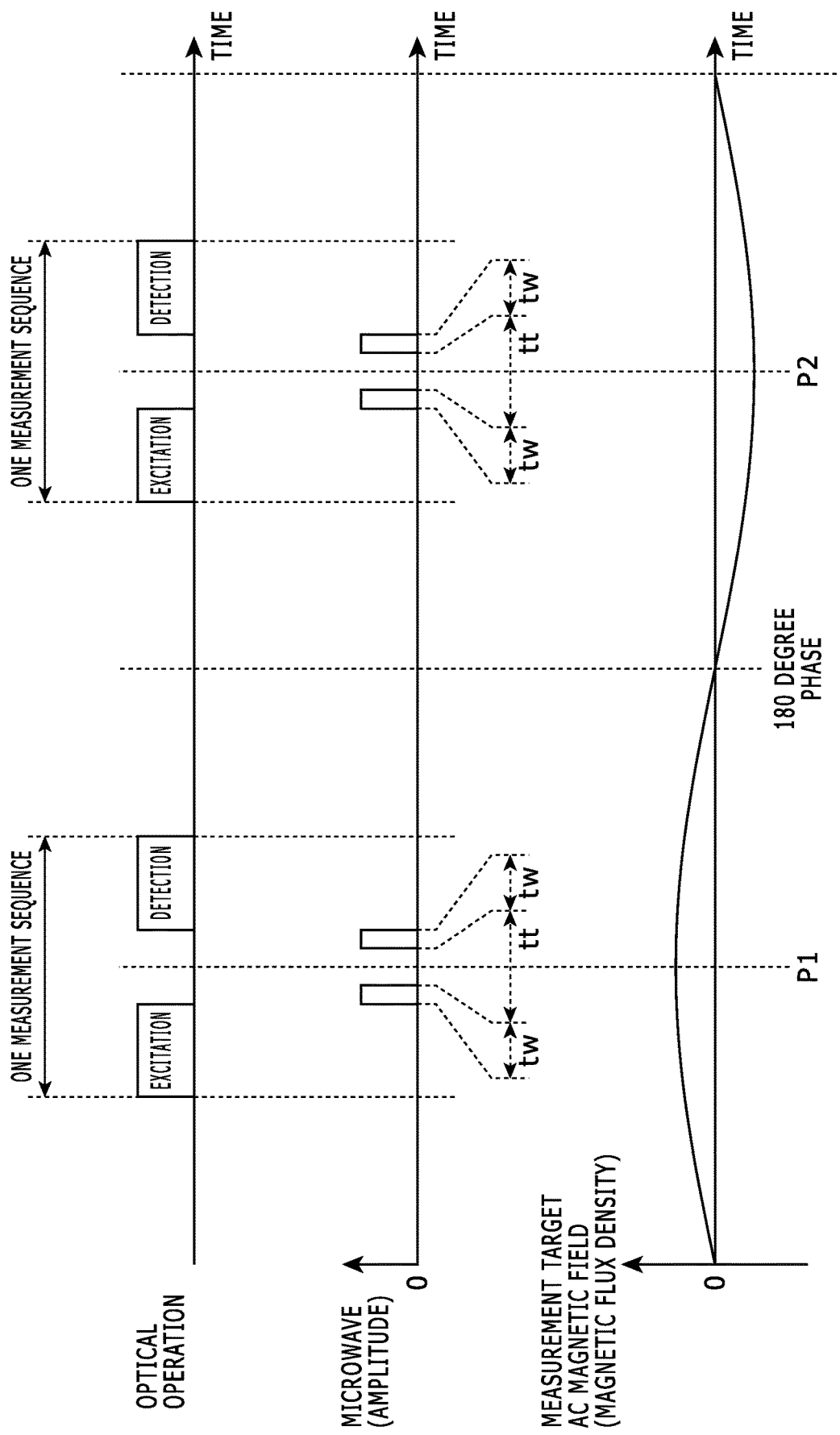
FIG. 2 shows a timing chart that explains a behavior of the magnetic field measurement apparatus in Embodiment 1.

The following part explains a behavior of the magnetic field measurement apparatus in Embodiment 1. FIG. 2 shows a timing chart that explains a behavior of the magnetic field measurement apparatus in Embodiment 1.

As shown in FIG. 2, for example, in Ramsey Pulse Sequence, the measurement control unit 21 (a) firstly irradiates the ODMR member 1 with excitation light of a predetermined wavelength using the irradiating device 4 and thereby forces a uniform electron spin state of the ODMR member 1, (b) subsequently, applies a microwave magnetic field of the first pi/2 pulse to the ODMR pulse 1 using the coil 2 and the high frequency power supply 3, (c) subsequently, when the predetermined time interval tt elapses, applies a microwave magnetic field of the second pi/2 pulse to the ODMR pulse 1 using the coil 2 and the high frequency power supply 3, and (d) subsequently, irradiates the ODMR member 1 with measurement light for projection measurement using the irradiating device 4 and receives fluorescence emitted by the ODMR member 1 using the light receiving device 5, and detects a received light intensity (i.e. a detection light intensity) of it.

It should be noted that during the time interval tt, a direction of the electron spin changes in proportion to a time integral of a magnetic flux density of an external magnetic field (here, the measurement target AC magnetic field), and therefore, a magnetic flux density of an external magnetic field (here, the measurement target AC magnetic field) can be derived from the detection light intensity.

Further, the time width tw of the pi/2 pulse is a time length required to rotate the electron spin by pi/2 (about a few tens of nanoseconds), and is determined in advance from a Rabi oscillation period or the like of the ODMR member 1. Furthermore, irradiation time lengths of the excitation light and the measurement light are any in a range from a few microseconds to a few tens of microseconds. Furthermore, a time length of the aforementioned time interval tt is equal to or less than a few hundred microseconds. Furthermore, the shorter time interval between the irradiation of the excitation light and the first pi/2 pulse and the shorter time interval between the second pi/2 pulse and the irradiation of the measurement light, the better, respectively.

In this sequence, the measurement control unit 21 performs the irradiation of the excitation light, the application of the first and second pi/2 pulses, the irradiation of the measurement light, and the measurement of the detection light intensity such that the first phase P1 of the measurement target AC magnetic field falls within a time period between the aforementioned first and second pi/2 pulses, namely within the aforementioned time interval tt (e.g. such that the first phase P1 gets a center of the time interval tt).

In the aforementioned manner, the detection light intensity at the first phase P1 is obtained by the measurement sequence performed at the phase P1, and the magnetic field calculation unit 22 calculates a magnetic flux density corresponding to this detection light intensity. In the same manner, the detection light intensity at the second phase P2 is obtained by the measurement sequence performed at the phase P2, and the magnetic field calculation unit 22 calculates a magnetic flux density corresponding to this detection light intensity.

Here, the first phase P1 is set as substantially 90 degrees, and the second phase P2 is set as substantially 270 degrees. Therefore, the magnetic field calculation unit 22 calculates as an amplitude of a magnetic flux density of the measurement target AC magnetic field one half of a difference between the magnetic flux density at the first phase P1 and the magnetic flux density at the second phase P2.

If the first and second phases P1 and P2 are not substantially 90 and 270 degrees, then as mentioned, in accordance with values of the first and second phases P1 and P2, an amplitude of a magnetic flux density of the measurement target AC magnetic field can be calculated from one half of the difference of them on the basis of the aforementioned ratio. Further, the measurement sequence at one of the first and second phases P1 and P2 may be omitted, and an amplitude of a magnetic flux density of the measurement target AC magnetic field may be calculated from a detection light intensity at only one phase (i.e. the other of the first and second phases P1 and P2).

Furthermore, the determined intensity of the measurement target AC magnetic field may be stored as data into a storage device (not shown), may be transmitted to an external device, may be displayed on a display device and/or the like.

Furthermore, a time length of the aforementioned one measurement sequence is usually set to be equal to or less than a half of a period of the measurement target AC magnetic field. The measurement target is an AC magnetic field of a low frequency equal to or less than about 1 kHz (in particular, equal to or less than about 100 Hz). Thus, a high-frequency AC magnetic field of which a half of a period is shorter than one measurement sequence is out of the measurement target.

It should be noted that decoherent time of electron spin is about one millisecond in Spin Echo Sequence as mentioned, and therefore, in general, proper measurement of a magnetic field intensity is hardly performed for a measurement target AC magnetic field having a frequency of about 1 kHz.

In Embodiment 1 as mentioned, the coil 2 applies a magnetic field of a microwave to the ODMR member 1 arranged in a measurement target AC magnetic field. The high frequency power supply 3 causes the coil 2 to conduct a current of the microwave. The irradiating device 4 irradiates the ODMR member 1 with light. The light receiving device 5 detects light that the ODMR member 1 emits. Further, the measurement control unit 21 performs a predetermined DC magnetic field measurement sequence at a predetermined phase of the measurement target AC magnetic field; and in the DC magnetic field measurement sequence, controls the high frequency power supply 3 and the irradiating device 4 and thereby determines a detection light intensity of the light detected by the light receiving device 5. The magnetic field calculation unit 22 calculates an intensity of the measurement target AC magnetic field on the basis of the predetermined phase and the detection light intensity.

Consequently, a low-frequency AC magnetic field is properly measured using ODMR.

Embodiment 2

If the measurement target AC magnetic field slowly changes (i.e. if the measurement target AC magnetic field has a low frequency equal to or less than 10 Hz (e.g. 2 Hz)), the magnetic field measurement apparatus in Embodiment 2 performs plural DC magnetic field measurement sequences (of which each is identical or similar to the sequence in Embodiment 1) for one phase Pi and thereby derives an intensity of the measurement target AC magnetic field at this one phase. In this process, the plural DC magnetic field measurement sequences are performed such that an average value of phases Pij (j=1, . . . , n) at which the plural (n) DC magnetic field measurement sequences are performed gets equal to the aforementioned phase Pi, and an average value of magnetic field intensities obtained by the plural DC magnetic field measurement sequences is derived as a magnetic field intensity at this phase Pi.

Therefore, in Embodiment 2, the measurement control unit 21 performs the predetermined DC magnetic field measurement sequences at a predetermined plural phases Pij of the measurement target AC magnetic field; and in each of the DC magnetic field measurement sequences, controls the high frequency power supply 3 and the irradiating device 4 and thereby determines a detection light intensity of the light detected by the light receiving device 5. Further, in Embodiment 2, the magnetic field calculation unit 22 considers an average value of the aforementioned plural phases Pij as one phase Pi as a measurement time point, and derives an intensity of the measurement target AC magnetic field on the basis of an average value of magnetic field intensities at the aforementioned plural phases Pij.

Figure 3:
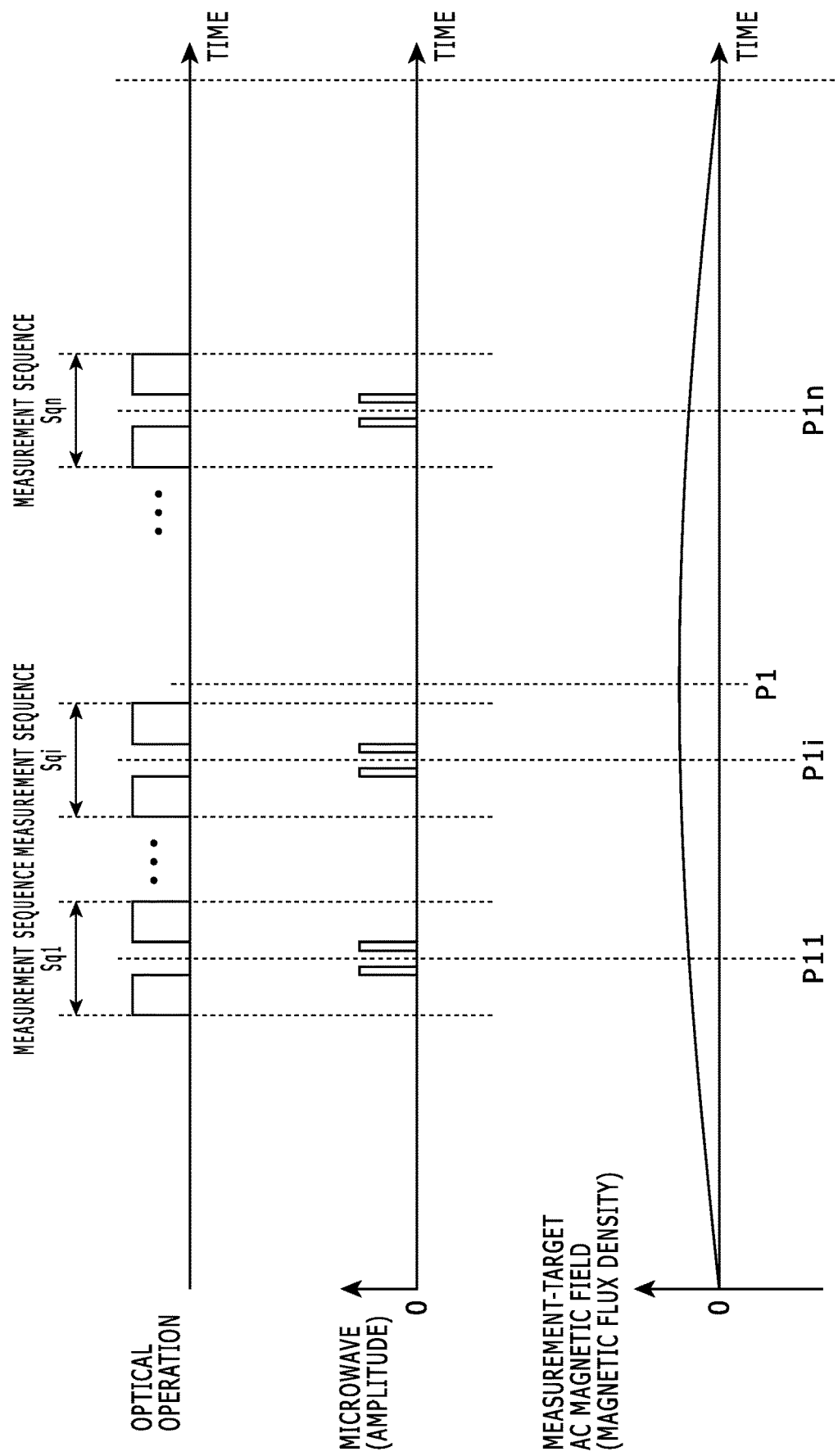
FIG. 3 shows a timing chart that explains a behavior of the magnetic field measurement apparatus in Embodiment 2.

FIG. 3 shows a timing chart that explains a behavior of the magnetic field measurement apparatus in Embodiment 2. For example, as shown in FIG. 3, for one phase Pi as one measurement time point (e.g. i=1 in FIG. 3), the measurement control unit 21 performs n (n>1) times of measurement sequences (here, n times of Ramsey Pulse Sequence). Consequently, magnetic field intensities Bij (j=1, . . . , n) corresponding to the phases Pij of the n measurement sequences are obtained by the magnetic field calculation unit 22. The magnetic field calculation unit 22 calculates an average value of the magnetic field intensities Bij, and sets the calculated average value as a magnetic field intensity Bi at the phase Pi.

In the aforementioned manner, in Embodiment 2, for one phase Pi, plural DC magnetic field measurement sequences Sq1 to Sqn are performed. For example, as well in Embodiment 1, if magnetic field intensities at two phases P1 and P2 should be measured, the aforementioned n DC magnetic field measurement sequences are performs for each of the two phases P1 and P2.

It should be noted that if the aforementioned plural phases Pij fall in both of a monotonic increase section (a section from 0-degree phase to 90-degree phase or a section from 270-degree phase to 360-degree phase) and a monotonic decrease section (a section from 90-degree phase to 180- degree phase or a section from 180-degree phase to 270-degree phase), an intensity of the measurement target AC magnetic field may be derived so as to (a) calculate the aforementioned phase average value and the aforementioned magnetic field intensity average value on the phases Pij that fall in the monotonic increase section and calculate a magnetic field intensity at 90-degree phase from the magnetic field intensity average value on the basis of the aforementioned ratio corresponding to the phase average value, (b) calculate the aforementioned phase average value and the aforementioned magnetic field intensity average value on the phases Pij that fall in the monotonic decrease section and calculate a magnetic field intensity at 90-degree phase from the magnetic field intensity average value on the basis of the aforementioned ratio corresponding to the phase average value, and (c) set an intensity of the measurement target AC magnetic field as an average value of the magnetic field intensities at 90-degree phase corresponding to the monotonic increase section and the monotonic decrease section.

Other parts of the configuration and behaviors of the magnetic measurement apparatus in Embodiment 2 are identical or similar to those in Embodiment 1, and therefore not explained here.

In Embodiment 2 as mentioned, the measurement control unit 21 performs the predetermined DC magnetic field measurement sequences at a predetermined plural phases Pij of the measurement target AC magnetic field, and in each of the DC magnetic field measurement sequences, controls the high frequency power supply 3 and the irradiating device 4 and thereby determines a detection light intensity of the light detected by the light receiving device 5; and the magnetic field calculation unit 22 considers an average value of the aforementioned plural phases Pij as one phase Pi as a measurement time point, calculates magnetic field intensities at the aforementioned plural phases Pij from detection light intensities at the aforementioned plural phases Pij, and derives an intensity of the measurement target AC magnetic field on the basis of an average value of the magnetic field intensities at the aforementioned plural phases Pij.

Consequently, a magnetic field intensity at each phase Pi is more properly measured, and a low-frequency AC magnetic field is properly measured using ODMR.

It should be understood that various changes and modifications to the embodiments described herein will be apparent to those skilled in the art. Such changes and modifications may be made without departing from the spirit and scope of the present subject matter and without diminishing its intended advantages. It is therefore intended that such changes and modifications be covered by the appended claims.

For example, in Embodiment 1 or 2, as an example, a waveform of the measurement target AC magnetic field is assumed as a sine wave. Alternatively, if a waveform of the measurement target AC magnetic field is known as another waveform (e.g. triangle wave, sawtooth wave or the like), a waveform of the measurement target AC magnetic field may be assumed as such wave form. In such a case, the aforementioned ratio should be derived on the basis of a shape of the aforementioned another waveform.

INDUSTRIAL APPLICABILITY

For example, the present invention is applicable to a magnetic measurement apparatus and a magnetic measurement method.

What is claimed is:

1. A magnetic measurement apparatus, comprising:
   an optically detected magnetic resonance member arranged in a measurement target AC magnetic field;
   a coil that applies a magnetic field of a microwave to the optically detected magnetic resonance member;
   a high frequency power supply that causes the coil to conduct a current of the microwave;
   an irradiating device that irradiates the optically detected magnetic resonance member with light;
   a light receiving device that detects light that the optically detected magnetic resonance member emits;
   a measurement control unit that performs a predetermined DC magnetic field measurement sequence at a predetermined phase of the measurement target AC magnetic field, and in the DC magnetic field measurement sequence, controls the high frequency power supply and the irradiating device and thereby determines a detection light intensity of the light detected by the light receiving device; and
   a magnetic field calculation unit that calculates an intensity of the measurement target AC magnetic field on the basis of the predetermined phase and the detection light intensity;
   wherein the measurement control unit performs the predetermined DC magnetic field measurement sequence at the predetermined phase in a case that the measurement target AC magnetic field is a high-frequency AC magnetic field and performs a plurality of predetermined DC magnetic field measurement sequences at predetermined plural phases in a case that the measurement target AC magnetic field is a low-frequency AC magnetic field.

2. The magnetic measurement apparatus according to claim 1, wherein the measurement control unit (a) performs the DC magnetic field measurement sequence at a predetermined first phase of the measurement target AC magnetic field, and (b) performs the DC magnetic field measurement sequence at a predetermined second phase of the measurement target AC magnetic field;
   the magnetic field calculation unit calculates the intensity of the measurement target AC magnetic field based on a difference between magnetic flux densities at the first and second phases from the first phase, the second phase, the detection light intensity at the first phase, and the detection light intensity at the second phase; and
   an absolute value of a difference between the first phase and pi/2 and an absolute value of a difference between the second phase and 3*pi/2 are substantially identical to each other.

3. The magnetic measurement apparatus according to claim 1, wherein the measurement control unit performs the plurality of predetermined DC magnetic field measurement sequences at the predetermined plural phases of the measurement target AC magnetic field further comprises:
   the magnetic field calculation unit sets the predetermined phase as an average value of the plural phases, and calculates the intensity of the measurement target AC magnetic field based on an average value of magnetic field intensities obtained by the DC magnetic field measurement sequences at the plural phases.

4. A magnetic measurement method, comprising the steps of:
   (a) performing a predetermined DC magnetic field measurement sequence at predetermined phase of a measurement target AC magnetic field using (a1) an optically detected magnetic resonance member arranged in a measurement target AC magnetic field, (a2) a coil that applies a magnetic field of a microwave to the optically detected magnetic resonance member, (a3) a high frequency power supply that causes the coil to conduct a current of the microwave, (a4) an irradiating device that irradiates the optically detected magnetic resonance member with light and (a5) a light receiving device that detects light that the optically detected magnetic resonance member emits, the predetermined DC magnetic field measurement sequence controlling the high frequency power supply and the irradiating device and thereby determining a detection light intensity of the light detected by the light receiving device; and (b) calculating an intensity of the measurement target AC magnetic field on the basis of the predetermined phase and the detection light intensity;

wherein the performing step further comprises performing the predetermined DC magnetic field measurement sequence at the predetermined phase in a case that the measurement target AC magnetic field is a high-frequency AC magnetic field and performing a plurality of predetermined DC magnetic field measurement sequences at predetermined plural phases in a case that the measurement target AC magnetic field is a low-frequency AC magnetic field.

5. The magnetic measurement apparatus according to claim 1, wherein the irradiating device and the light receiving device are disposed on a same side with respect to the optically detected magnetic resonance member.

6. The magnetic measurement apparatus according to claim 1, wherein the control unit performs control to determine whether the measurement target AC magnetic field being a high-frequency AC magnetic field or a low-frequency AC magnetic field.

7. The magnetic measurement apparatus according to claim 6, wherein the low-frequency AC magnetic field is a frequency equal to or less than 10 Hz.

* * * * *